United States Patent
Li et al.

(10) Patent No.: US 12,015,486 B2
(45) Date of Patent: Jun. 18, 2024

(54) DATA RETRANSMISSION DECODING METHOD, APPARATUS AND SYSTEM, AND COMMUNICATION DEVICE

(71) Applicant: ZTE CORPORATION, Guangdong (CN)

(72) Inventors: Yang Li, Guangdong (CN); Lilin Wang, Guangdong (CN); Xueqiang Wu, Guangdong (CN); Degang Zhang, Guangdong (CN); Jianan Wang, Guangdong (CN)

(73) Assignee: ZTE CORPORATION, Guangdong (CN)

( * ) Notice: Subject to any disclaimer, the term of this patent is extended or adjusted under 35 U.S.C. 154(b) by 420 days.

(21) Appl. No.: 17/418,773

(22) PCT Filed: Sep. 27, 2019

(86) PCT No.: PCT/CN2019/108577
§ 371 (c)(1),
(2) Date: Jun. 25, 2021

(87) PCT Pub. No.: WO2020/134258
PCT Pub. Date: Jul. 2, 2020

(65) Prior Publication Data
US 2022/0069946 A1    Mar. 3, 2022

(30) Foreign Application Priority Data

Dec. 27, 2018    (CN) .......................... 201811609673.1

(51) Int. Cl.
*H04L 1/1607*    (2023.01)
*H04L 1/00*    (2006.01)

(52) U.S. Cl.
CPC ............ *H04L 1/1607* (2013.01); *H04L 1/005* (2013.01); *H04L 1/0057* (2013.01); *H04L 1/0061* (2013.01)

(58) Field of Classification Search
CPC ..... H04L 1/1607; H04L 1/005; H04L 1/0057; H04L 1/0061
See application file for complete search history.

(56) References Cited

U.S. PATENT DOCUMENTS

| 2011/0119552 A1 | 5/2011 | Park et al. |
| 2012/0054572 A1 | 3/2012 | Andersen et al. |

(Continued)

FOREIGN PATENT DOCUMENTS

| CN | 101069357 A | 11/2007 |
| CN | 101388742 A | 3/2009 |

(Continued)

OTHER PUBLICATIONS

ZTE Corporation, European Extended Search Report, EP 19904118. 7, Jan. 14, 2022, 12 pgs.

(Continued)

*Primary Examiner* — Duc C Ho
(74) *Attorney, Agent, or Firm* — NZ CARR LAW OFFICE

(57) ABSTRACT

Disclosed are a data retransmission decoding method, apparatus and system, and a communication device. The method includes: obtaining retransmitted data to be decoded, the retransmitted data to be decoded including a code block to be decoded (S102); according to stored check state information of a previously decoded code block, judging whether the code block to be decoded includes a target code block required to be decoded again (S104); and if the code block to be decoded includes the target code block required to be decoded again, merging and decoding a currently stored first (Continued)

code block and the target code block based on a predetermined decoding parameter (S106), wherein the first code block is a code block corresponding to the target code block.

20 Claims, 6 Drawing Sheets

(56) References Cited

U.S. PATENT DOCUMENTS

| | | | |
|---|---|---|---|
| 2014/0126551 A1 | 5/2014 | Nammi et al. | |
| 2018/0269899 A1* | 9/2018 | Noh | H03M 13/2906 |
| 2019/0068326 A1* | 2/2019 | Sonobe | H04L 1/1819 |

FOREIGN PATENT DOCUMENTS

| | | | |
|---|---|---|---|
| CN | 101399651 A | 4/2009 | |
| CN | 101001133 B | 4/2010 | |
| CN | 104683073 A | 6/2015 | |
| CN | 107181575 A | 9/2017 | |
| CN | 107181576 A | 9/2017 | |
| CN | 107294667 A | 10/2017 | |
| JP | 2008011460 A | 1/2008 | |
| JP | 2014229944 A | 12/2014 | |
| WO | 2018021819 A1 | 2/2018 | |
| WO | 2018143857 A1 | 8/2018 | |

OTHER PUBLICATIONS

Examination Report of Counterpart European Patent Application No. 19904118.7 issued on Jun. 22, 2023.
Mediatek Inc., On HARQ buffering, 3GPP Draft; R1-1718349_HARQ Buffering_Final, 3rd Generation Partnership Project (3GPP), Oct. 9-13, 2017, vol. RAN WG1, No. Prague.
ZTE Corporation, JP First Office Action with English Translation, JP2021-537942, Jul. 4, 2022, 10 pgs.
ZTE Corporation, CN First Office Action with English Translation, CN 2018116096731, Jul. 22, 2022, 19 pgs.
ZTE Corporation, PCT International Search Report and English Translation, PCT/CN2019/108577, Dec. 27, 2019, 6 pgs.
ZTE Corporation, PCT Isa Written Opinion, PCT/CN2019/108577, Dec. 27, 2019, 3 pgs.

* cited by examiner

DATA RETRANSMISSION DECODING METHOD, APPARATUS AND SYSTEM, AND COMMUNICATION DEVICE

CROSS REFERENCE TO RELATED APPLICATIONS

The present application is a United States National Stage Application filed under 35 U.S.C. § 371 of PCT Patent Application Serial No. PCT/CN2019/108577, filed on Sep. 27, 2019, which claims priority to Chinese Patent Application No. 201811609673.1, entitled "DATA RETRANSMISSION DECODING METHOD, APPARATUS AND SYSTEM, AND COMMUNICATION DEVICE," filed Dec. 27, 2018, each of which is incorporated herein by reference in its entirety.

TECHNICAL FIELD

The present disclosure relates to the technical field of wireless communication, in particular to a data retransmission decoding method, apparatus and system, and a communication device.

BACKGROUND

With the continuous development of mobile communication network technology, in LTE services and 5G services, the channel transmission quality becomes very poor due to a channel noise, a fading caused by mobility and an interference caused by other users. Therefore, an incremental redundancy retransmission may be used to protect the transmission data.

When performing data retransmission, a sender may send data information and a part of redundant information during a first transmission; after a receiver fails to merge and decode the data information mainly composed of a transport block (TB) or a code block group (CBG) and the part of redundant information, the receiver may request to send retransmission data; the sender usually sends extra redundant information when retransmitting data, through which the channel coding rate can be reduced and the decoding success rate can be improved.

However, with the increasing number of users, especially in the 5G service, the amount of data continues to increase, which on one hand may reduce the decoding ability of a decoder during retransmission, on the other hand, excessive amount of data may lead to the inability to configure a higher number of iterations, resulting in relatively low decoding performance. Moreover, in the case of a relatively low bit rate, the amount of data to be decoded is relatively small, which may lead to the waste of decoding ability because the number of iterations and throughput of the decoder are fixed.

SUMMARY

Some embodiments of the present disclosure provide a data retransmission decoding method, applied to a decoding unit and includes: obtaining retransmitted data to be decoded, the retransmitted data to be decoded including a code block to be decoded; judging whether the code block to be decoded includes a target code block required to be decoded again according to stored check state information of a previously decoded code block; and merging and decoding a currently stored first code block and the target code block based on a predetermined decoding parameter if the code block to be decoded includes the target code block required to be decoded again, where the first code block is a code block corresponding to the target code block.

Some embodiments of the present disclosure provide a data retransmission decoding method, which is applied to a data sending unit, and includes: receiving check state information of a code block based on new transmission decoding data sent by a decoding unit; determining a decoding parameter according to the check state information of the code block; and sending the decoding parameter to the decoding unit, so that the decoding unit decodes and checks retransmitted data to be decoded according to the decoding parameter.

Some embodiments of the present disclosure provide a data retransmission decoding system. The communication system includes a decoding unit and a data sending unit, where: the data sending unit is configured to receive check state information of a code block based on new transmission decoding data or retransmitted data to be decoded sent by the decoding unit, determine a decoding parameter according to the check state information of the code block, and send the decoding parameter to the decoding unit; and the decoding unit is configured to obtain the new transmission decoding data or the retransmitted data to be decoded, where the new transmission decoding data and the retransmitted data to be decoded include a code block to be decoded; judge whether the code block to be decoded includes a target code block required to be decoded again according to stored check state information of a previously decoded code block; and merge and decode a currently stored first code block and the target code block based on the decoding parameter if the code block to be decoded includes the target code block required to be decoded again, where the first code block is a code block corresponding to the target code block.

Some embodiments of the present disclosure further provide a data retransmission decoding apparatus. The apparatus includes: a first obtaining module, configured to obtain retransmitted data to be decoded, where the retransmitted data to be decoded includes a code block to be decoded; a judging module, configured to judge whether the code block to be decoded includes a target code block required to be decoded again according to stored check state information of a previously decoded code block; and a decoding module, configured to merge and decode a currently stored first code block and the target code block based on a predetermined decoding parameter if the code block to be decoded includes the target code block required to be decoded again, where the first code block is a code block corresponding to the target code block.

Some embodiments of the present disclosure further provide a data retransmission decoding apparatus. The apparatus includes: a second receiving module, configured to receive check state information of a code block based on new transmission decoding data sent by a decoding unit; a parameter determining module, configured to determine a decoding parameter according to the check state information of the code block; and a sending module, configured to send the decoding parameter to the decoding unit, so that the decoding unit decodes and checks retransmitted data to be decoded according to the decoding parameter.

Some embodiments of the present disclosure use the following technical solution, which includes: obtaining retransmitted data to be decoded, the retransmitted data to be decoded including a code block to be decoded; judging whether the code block to be decoded includes a target code block required to be decoded again according to stored check state information of a previously decoded code block; and merging and decoding a currently stored first code block and the target code block based on a predetermined decoding parameter if the code block to be decoded includes the target code block required to be decoded again, where the first code block is a code block corresponding to the target code block.

BRIEF DESCRIPTION OF THE DRAWINGS

The accompanying drawings described here are used to provide a further understanding of the present disclosure and constitute a part of the present disclosure. The illustrative embodiments and descriptions of the present disclosure are used to explain the present disclosure, and do not constitute an improper limitation of the present disclosure.

DETAILED DESCRIPTION

In order to make the objectives, technical solutions and advantages of the present disclosure clearer, the technical solutions of the present disclosure will be described clearly and completely with reference to specific embodiments of the present disclosure and corresponding drawings. It is obvious that the described embodiments are only some embodiments of the present disclosure, rather than all embodiments. Based on the embodiments in the present disclosure, all other embodiments obtained by those skilled in the art without creative work are within the protection scope of the present disclosure.

The technical solutions provided by each embodiment of the present disclosure will be described in detail with reference to the accompanying drawings.

Embodiment 1

Figure 1:
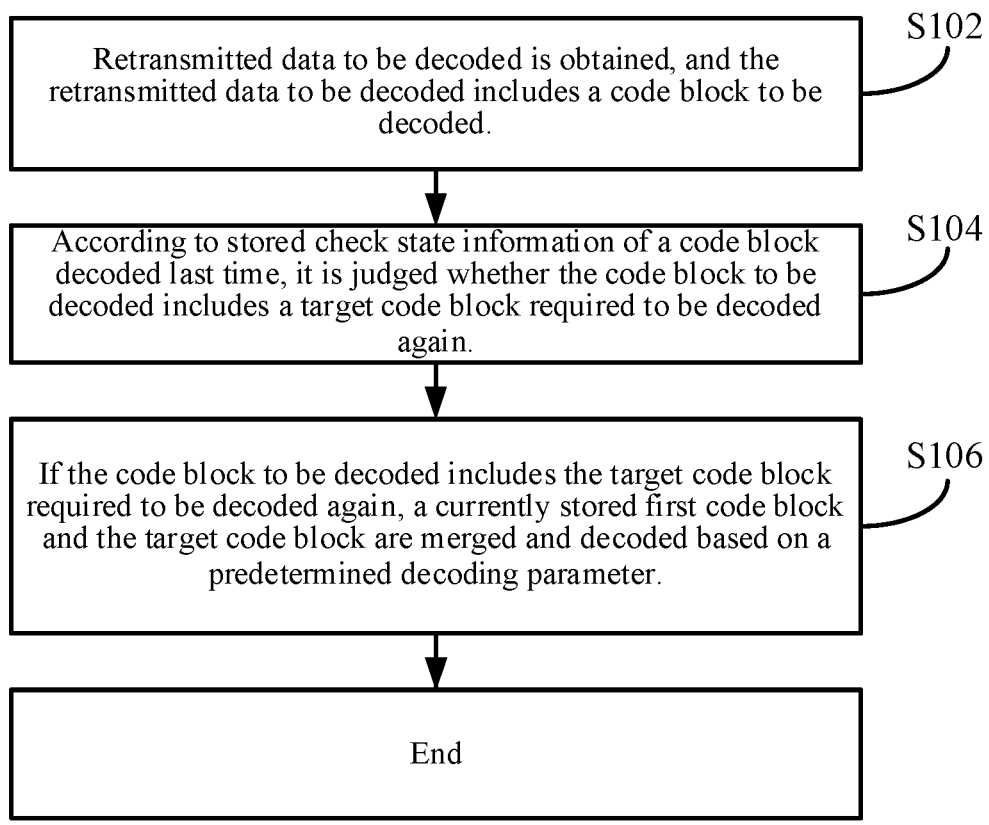
FIG. 1 is a schematic flow chart of a data retransmission decoding method according to an embodiment of the present disclosure.

As shown in FIG. 1, an embodiment of the present disclosure provides a data retransmission decoding method. An execution body of the method may be a decoding unit, which may be a decoding unit in any communication device (such as a base station or a terminal device, etc.). The method may specifically include the following steps.

In step S102, retransmitted data to be decoded is obtained, and the retransmitted data to be decoded includes a code block to be decoded.

Herein, the retransmitted data to be decoded may be data containing multiple redundant bit information, where the redundant bit information may be one or more of any redundant bit information such as check bit information and cyclic redundancy check (CRC) information. The code block to be decoded may be any transport block (TB) or code block group (CBG) to be decoded.

In implementation, with the continuous development of mobile communication network technology, in a LTE service, the channel transmission quality becomes very poor due to a channel noise, a fading caused by mobility and an interference caused by other users. Therefore, an incremental redundancy retransmission may be used to protect the transmission data. When retransmitting data, a sender may send data information and a part of redundant information during a first transmission. After a receiver fails to merge and decode the data information mainly composed of the transport block (TB) or the code block group (CBG) and the part of redundant information, the receiver may request to send retransmission data. The sender usually sends extra redundant information when retransmitting data, through which the channel coding rate can be reduced and the decoding success rate can be improved.

However, with the increasing number of users, especially in a 5G service, the amount of data continues to increase, which on one hand may reduce the decoding ability of a decoder during retransmission, on the other hand, excessive amount of data may lead to the inability to configure a higher number of iterations, resulting in relatively low decoding performance. Moreover, in the case of a relatively low bit rate, the amount of data to be decoded is relatively small, which may lead to the waste of decoding ability because the number of iterations and a throughput of the decoder are fixed. Therefore, the embodiment of the present disclosure provides a technical solution that may solve the above-described problems, which may specifically include the following contents.

When the decoding unit decodes data to be decoded and redundant data (such as the redundant bit information) received for the first time, and checks a decoding result, if there is an erroneous decoding result, the decoding unit may send a second data request to an upper system (such as a data sending unit), that is, a request for obtaining the retransmitted data to be decoded. The upper system may send the retransmitted data to be decoded to the decoding unit, where the retransmitted data to be decoded may contain the code block to be decoded and redundant bit information different from the redundant data in the data to be decoded sent for the first time.

For example, in the 5G service, user information data may be coded using a low density parity check code (LDPC) coding method. After coding, a check matrix based on a code block of each user information data may be obtained, where the check matrix may contain the user information data and corresponding check data. The user information data in the check matrix may be used as the data to be decoded, and the corresponding check data may be used as the redundant data. The data to be decoded sent for the first time may be multiple check matrixes containing each user information data and the check data, that is, multiple code blocks to be decoded. After receiving the multiple code blocks to be decoded, the decoding unit decodes the code blocks. If there is an erroneous decoding result, the decoding unit may send the second data request, that is, the request for obtaining the retransmitted data to be decoded. At this time, the upper system may perform a secondary coding for each user information data, and a check matrix obtained after the coding may be different from the first coding. For example, in a check matrix A based on a user A obtained from the first coding, there may be 22 columns of user real information data and 5 columns of check data. In a check matrix B based on the user A obtained from the second coding, there may be 22 columns of user real information data and 32 columns of check data. After the second coding of the user information data, the obtained check matrix may be sent to the decoding unit as the retransmitted data to be decoded, and the decoding unit may obtain the retransmitted data to be decoded.

In addition, services other than the 5G service may also include various coding methods. Taking a Turbo coding as an example, after performing the Turbo coding on each code block, three bit information of a systematic bit, a first parity bit and a second parity bit are generated corresponding to the data of each code block. In a first data output, data information of the code block and one or more redundant data among the above three redundant bit information may be merged and sent to the decoding unit. After receiving the data to be decoded and the redundant data, the decoding unit may merge and decode the data to be decoded and the redundant data. If there is an erroneous decoding result, it may send a second data request to the upper system, that is, a sending request for the retransmitted data to be decoded. After receiving the sending request for the retransmitted data to be decoded, the upper system may send the retransmitted data to be decoded to the decoding unit, where the retransmitted data to be decoded may contain the same data as the data to be decoded sent for the first time, and the redundant data contained may be different from the redundant data sent for the first time. For example, the data to be decoded sent for the first time is a code block 1 to a code block 3, and the redundant data sent for the first time may be systematic bit of each code block. The retransmitted data to be decoded sent for the second time may be the code block 1 to the code block 3, and the redundant data corresponding to the retransmitted data to be decoded may be two parity bits of each code block, namely, a first parity bit and a second parity bit. The redundant data corresponding to the retransmitted data to be decoded may also be redundant data containing all bit information.

In addition, the redundant data contained in the code block may be parity check data, and may also contain other check bit information, such as check bit information generated by the cyclic redundancy check, a Hartenberg (H) matrix check, or a check mode combining the cyclic redundancy check with the H matrix check, etc. The specific redundant data content may be different according to the actual situation, which is not limited in the embodiments of the present disclosure.

In step S104, according to stored check state information of a previously decoded code block, it is judged whether the code block to be decoded includes a target code block required to be decoded again.

Herein, the check state information of the code block may be check state information obtained after checking a decoding result of the code block according to different check modes.

In implementation, the check state information of the code block may be the check state information of the code block stored by the decoding unit after checking a decoding result of the data to be decoded received for the first time. According to the check state information of the code block, it may be determined whether the received summarization of the retransmitted data to be decoded contains the target code block required to be decoded again. For example, the retransmitted data to be decoded includes a code block 1 to a code block 5. The check state information of the code block of the code block 1 to the code block 5 stored in the decoding unit may be: code block 1—correct, code block 2—error, code block 3—correct, code block 4—correct and code block 5—error, so that the code block 2 and the code block 5 may be determined to be the target code blocks required to be decoded again according to the check state information of the code block of the code block 1 to the code block 5.

In step S106, if the code block to be decoded includes the target code block required to be decoded again, a currently stored first code block and the target code block are merged and decoded based on a predetermined decoding parameter.

Herein, the predetermined decoding parameter may include a predetermined number of iterations. The predetermined number of iterations may be the number of iterations determined by the decoding unit according to the check state information of the code block, or the number of iterations determined by the upper system (such as the data sending unit) according to the check state information of the code block, or a predetermined number of iterations set by a user. The currently stored first code block may be a code block contained in the previously received data to be decoded. A currently stored code block corresponding to the target code block may be a code block found in the currently stored code block according to a serial number or other identifier of the target code block.

In implementation, after the target code block is determined, the code block corresponding to the target code block may be found out from the currently stored code block, and the code block and the target code block are merged and decoded. For example, taking the LDPC coding method as an example, the retransmitted data to be decoded contains three code blocks, namely a code block 1 to a code block 3. According to the stored check state information of the code block, it may be determined that code block 2 has been correctly decoded in the previous decoding, so the target code blocks are the code block 1 and the code block 3, that is, the code block 1 and the code block 3 need to be decoded again. The currently stored code block 1 is a matrix A1 previously obtained based on data information of a user A by the LDPC method, where the matrix A1 contains 22 columns of user real data information and 5 columns of check information. The currently stored code block 3 is a matrix C1 previously obtained based on data information of a user C by the LDPC method, where the matrix C1 contains 22 columns of user real data information and 7 columns of check information. In the obtained retransmission data to be decoded, the matrix of the code block 1 is A2, and A2 contains 22 columns of user real data information and 9 columns of check information. A matrix C2 of the code block 3 contains 22 columns of user real data information and 9 columns of check information. The matrix A1 and the matrix A2 may be merged and decoded to obtain a decoding result and check result corresponding to the code block 1. The matrix C1 and the matrix C2 of the code block 3 may also be merged and decoded to obtain the decoding result and check result of the code block 3. If the check results of the code block 1 and the code block 3 are correct, the decoding results of the code block 1 and the code block 3 are the decoding results of merging and decoding, where in the process of the merging and decoding, it needs to be based on the predetermined decoding parameter, that is, a predetermined number of iterations and a predetermined redundancy version number.

The decoding result of the merging and decoding may be merged with a stored decoding that was correctly decoded previously to determine a retransmission decoding result. Or, the stored decoding result of the previous decoding may be updated by the decoding result of the merging and decoding; a correct decoding result in the decoding result of the merging and decoding replaces the stored decoding result of the previous decoding to determine the retransmission decoding result.

The embodiment of the present disclosure provides a data retransmission decoding method, which includes obtaining retransmitted data to be decoded, the retransmitted data to be decoded including a code block to be decoded; judging whether the code block to be decoded includes a target code block required to be decoded again according to stored check state information of a previously decoded code block; and merging and decoding a currently stored first code block and the target code block based on a predetermined decoding parameter if the code block to be decoded includes the target code block required to be decoded again, where the first code block is a code block corresponding to the target code block. In this way, the decoding unit may determine the target code block required to be decoded again according to the check state information of the code block, and only decode the target code block required to be decoded again according to the received retransmission data, which may ensure the decoding quality and improve the decoding performance when the data amount is relatively large, and may also dynamically calculate the number of decoding and iterations online in real time according to the number of the code blocks to be decoded, thus improving the performance of the decoder.

Embodiment 2

Figure 2:
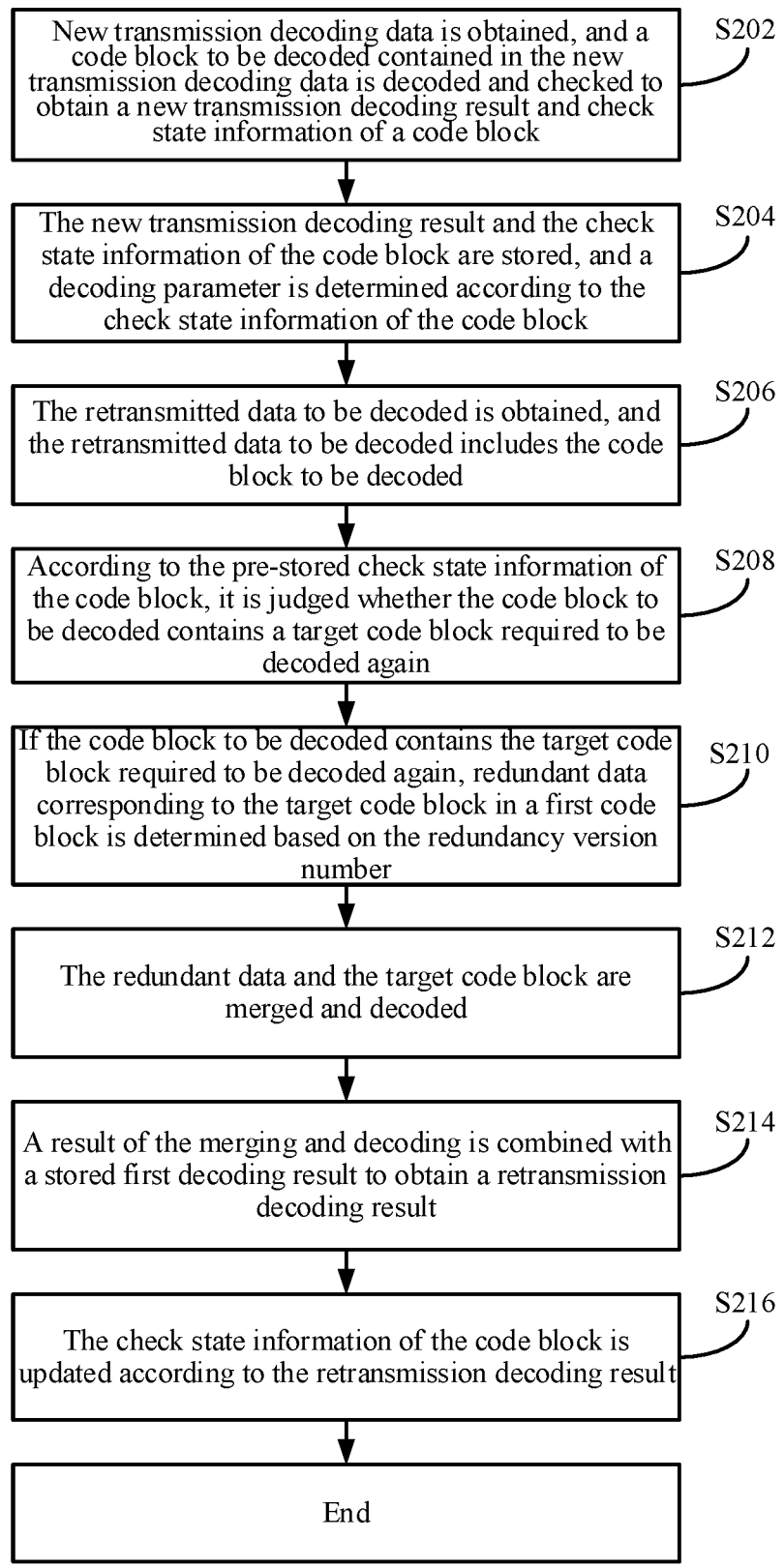
FIG. 2 is a schematic flow chart of a data retransmission decoding method according to another embodiment of the present disclosure.

As shown in FIG. 2, an embodiment of the present disclosure provides a data retransmission decoding method. An execution body of the method may be a decoding unit, which may be a decoding unit in any communication device (such as a base station or a terminal device, etc.). The method may specifically include the following steps.

In step S202, new transmission decoding data is obtained, and a code block to be decoded contained in the new transmission decoding data is decoded and checked to obtain a new transmission decoding result and check state information of a code block.

Herein, the new transmission decoding data may be any data including a transmission block or a code block group.

In implementation, the decoding unit may decode and check the code block to be decoded in the obtained new transmission decoding data, and store the obtained new transmission decoding result and the check state information of the code block. For example, the new transmission decoding data may contain five code blocks, namely a code block 1 to a code block 5. The five code blocks are decoded and checked to obtain a decoding result and a check result corresponding to each code block, and the decoding results and the check results of the five code blocks are stored. For example, taking a Turbo coding as an example, each code block may contain three check bit information, namely, a systematic bit, a first parity bit and a second parity bit, where the systematic bit is the bit information necessary for decoding. Each code block in the new transmission decoding data may carry its corresponding systematic bit and partial parity bit. For example, the new transmission decoding data may contain data of five code blocks, systematic bit information corresponding to all code blocks, and bit information of the first parity bits of the code block 1 and the code block 2. After receiving the new transmission decoding data, the decoding unit may decode and check the code block according to the redundant bit information of each code block. After a decoding result is obtained, the decoding result of each code block may be checked. If the check result is: code block 1-correct, code block 2-error, code block 3-correct, code block 4-correct and code block 5-error, then the new transmission decoding result and the check state information of the code block corresponding to each code block may be stored.

In step S204, the new transmission decoding result and the check state information of the code block are stored, and a decoding parameter is determined according to the check state information of the code block.

Herein, the decoding parameter may include a redundancy version number and the number of iterations, and the number of iterations may be a parameter determined by the decoding unit according to the stored check state information of the code block.

In implementation, in addition to merging and decoding through the predetermined decoding parameter in step S106 of Embodiment 1, the decoding unit may also determine a decoding parameter of retransmitted data to be decoded according to the check state information of the code block after decoding the new transmission decoding data. For example, the decoding parameter of the retransmitted data to be decoded may be a decoding parameter determined by the decoding unit according to its own data processing capability or a decoding parameter determined by the decoding unit according to the number of target code blocks in the retransmitted data to be decoded. Herein, the fewer error code blocks in the check state information of the code block, the larger the corresponding number of iterations, and the better the decoding performance of the decoding unit.

In step S206, the retransmitted data to be decoded is obtained, and the retransmitted data to be decoded includes the code block to be decoded.

In step S208, according to the pre-stored check state information of the code block, it is judged whether the code block to be decoded contains a target code block required to be decoded again.

The specific processing procedures of the above steps S206-S208 may refer to the relevant contents in S102-S104 of the Embodiment 1, and may not be repeated here.

In step S210, if the code block to be decoded contains the target code block required to be decoded again, redundant data corresponding to the target code block in a first code block is determined based on the redundancy version number.

In implementation, redundant data in the retransmitted data to be decoded may be stored in a circulator. After the Turbo coding, three different bit information of each code block are obtained. First, a systematic bit of the code block is stored in the circulator, and then a first parity bit and/or a second parity bit to be transmitted are sequentially stored. After receiving the circulator storing the redundant data, the decoding unit may determine a starting position of extracting the redundant data according to the redundancy version number.

In step S212, the redundant data and the target code block are merged and decoded.

Based on the redundancy version number, the code block to be decoded is merged and decoded to obtain a decoding result of the merging and decoding.

According to the size of a decoding matrix during new transmission and the size of a decoding matrix during retransmission, if the redundancy version numbers are the same, then a retransmission decoding delay is n times of a new transmission decoding delay, and then the decoding processing capacity during retransmission decoding is only 1/n of that during new transmission decoding. If an error code block rate is m % under a channel condition at this time, and the all retransmission decoding delay of the whole transmission block is X, then the delay for decoding only the error code block is m %*X, that is, in the same time, the ability to decode the error code block is 1/(m %) times higher than the ability to decode all code blocks again.

In step S214, a result of the merging and decoding is combined with a stored first decoding result to obtain a retransmission decoding result.

Herein, the first decoding result may be a decoding result of a code block decoded correctly in a previous decoding process.

In implementation, after decoding the error code block again, the retransmission decoding result (i.e., the result of the merging and decoding) and the stored first decoding result may be combined and output. For example, according to the stored check state information of the code block, it may be determined that the correct code blocks are the code block 2, the code block 4 and the code block 5, and the error code blocks required to be decoded again are the code block 1 and the code block 3. Then after decoding the code block 1 and the code block 3 again, a new result of merging and decoding the block 1 and the code block 3 may be obtained. The result of the merging and decoding and the stored first decoding results of the code block 2, the code block 4 and the code block 5 may be merged and sorted for output. For example, the stored decoding result of the code block 2 is a, the decoding result of the code block 4 is b, the decoding result of the code block 5 is c, the result of the merging and decoding after a retransmission decoding of the code block 1 is d, and the result of the merging and decoding after a retransmission decoding of the code block 3 is e, the output decoding results may be sorted and output according to the order of the code blocks, that is, the obtained retransmission decoding results may be d, a, e, b, c.

In step S216, the check state information of the code block is updated according to the retransmission decoding result.

In implementation, when decoding the retransmitted data to be decoded, if there is an erroneous decoding result when checking the decoding result of the target code block, the stored check state information of the code block may be updated according to the decoding check state. For example, the target code blocks required to be decoded again are the code block 1 and the code block 3, and the check state information of the code blocks of the code block 2, the code block 4 and the code block 5 is correct and does not need to be decoded again. If the code block 1 and the code block 3 are retransmitted and decoded, an obtained retransmission result to be decoded of the code block 1 is correct and an obtained retransmission result to be decoded of the code block 3 is erroneous, then the retransmission result to be decoded may be stored in the check state information of the code block, that is, the corresponding check state information of the code block of the code block 1 is changed to correct, while the check state information of the code block of the code block 3 is still erroneous.

The embodiment of the present disclosure provides a data retransmission decoding method, which includes obtaining retransmitted data to be decoded, the retransmitted data to be decoded including a code block to be decoded; judging whether the code block to be decoded includes a target code block required to be decoded again according to stored check state information of a previously decoded code block; and merging and decoding a currently stored first code block and the target code block based on a predetermined decoding parameter if the code block to be decoded includes the target code block required to be decoded again, where the first code block is a code block corresponding to the target code block. In this way, the decoding unit may determine the target code block required to be decoded again according to the check state information of the code block, and only decode the target code block required to be decoded again according to the received retransmission data, which may ensure the decoding quality and improve the decoding performance when the data amount is relatively large, and may also dynamically calculate the number of decoding and iterations online in real time according to the number of the code blocks to be decoded, thus improving the performance of the decoder.

Embodiment 3

Figure 3:
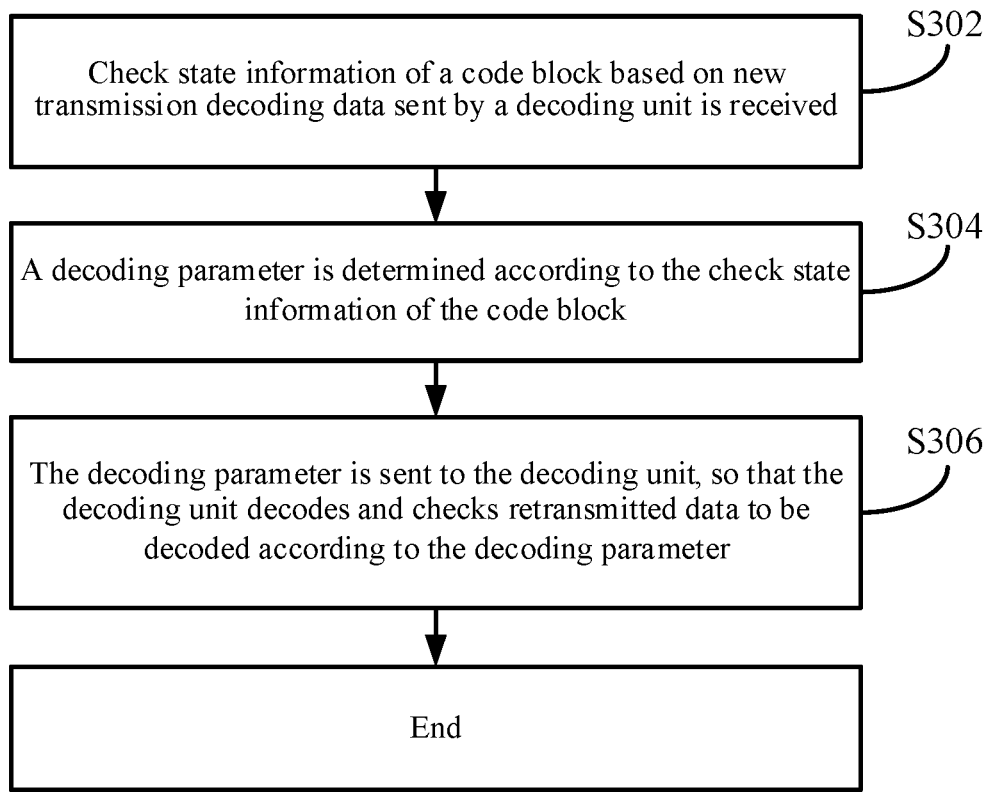
FIG. 3 is a schematic flow chart of a data retransmission decoding method according to yet another embodiment of the present disclosure.

As shown in FIG. 3, an embodiment of the present disclosure provides a data retransmission decoding method. An execution body of the method may be a data sending unit, which may be a data sending unit in any communication device (such as a base station or a terminal device, etc.). The method may specifically include the following step.

In step S302, check state information of a code block based on new transmission decoding data sent by a decoding unit is received.

In step S304, a decoding parameter is determined according to the check state information of the code block.

In implementation, a data sending unit may determine the decoding parameter during retransmission decoding according to the number of error code blocks in the check state information of the code block and the decoding capability of the decoding unit. The decoding parameter may include a redundancy version number and the number of iterations, where the decoding capability of the decoding unit may include the number of decoding hard cores of the decoding unit, a decoding delay of a single code block, etc.

Figure 4:
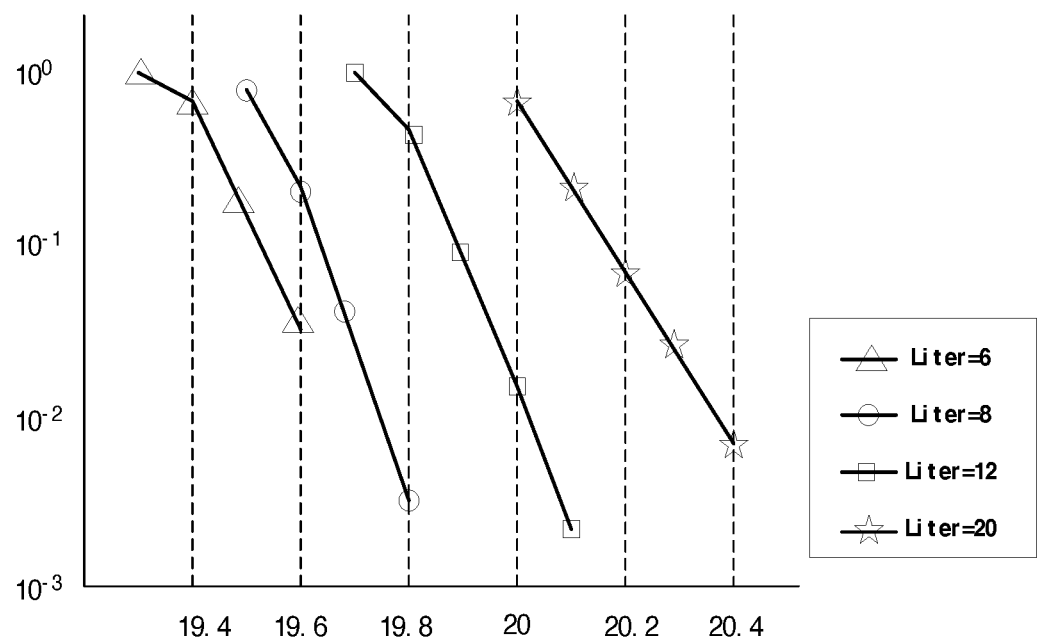
FIG. 4 is a schematic diagram of a relationship between the number of iterations and a packet error rate according to the present disclosure.

In addition, the fewer error code blocks in the check state information of the code block, the larger the number of iterations, the higher the corresponding decoding accuracy rate and the better the decoding performance. Under the conditions of different signal-to-noise ratios, the number of iterations required to achieve an approximate bit error rate may be different. For example, as shown in FIG. 4, under a channel condition of an additive white Gaussian noise (AWGN), 100 resources blocks (RB) and a modulation and coding scheme (MCS) 28 are taken as an example. In a simulation result in FIG. 4, the horizontal axis indicates the signal-to-noise ratio, the vertical axis indicates a packet error rate, and the broken line indicates the number of iterations. It can be seen from FIG. 4 that under the premise of the same packet error rate, the performance of 20 iterations is more than 1 dB higher than that of 6 iterations.

In step S306, the decoding parameter is sent to the decoding unit, so that the decoding unit decodes and checks retransmitted data to be decoded according to the decoding parameter.

The embodiment of the present disclosure provides a data retransmission decoding method, which includes receiving the check state information of the code block based on the new transmission decoding data sent by the decoding unit; determining the decoding parameter according to the check state information of the code block; and sending the decoding parameter to the decoding unit, so that the decoding unit decodes and checks the retransmitted data to be decoded according to the decoding parameter. In this way, the data sending unit may determine the decoding parameter according to the check state information of the code block sent by the decoding unit, and may determine corresponding decoding parameter according to different check state information of the code block, which may ensure that the decoding parameter used in retransmission decoding is dynamically adjusted according to different check state information of the code block, thus ensuring the decoding quality, saving system resources and improving the performance of a decoder.

Embodiment 4

Figure 5:
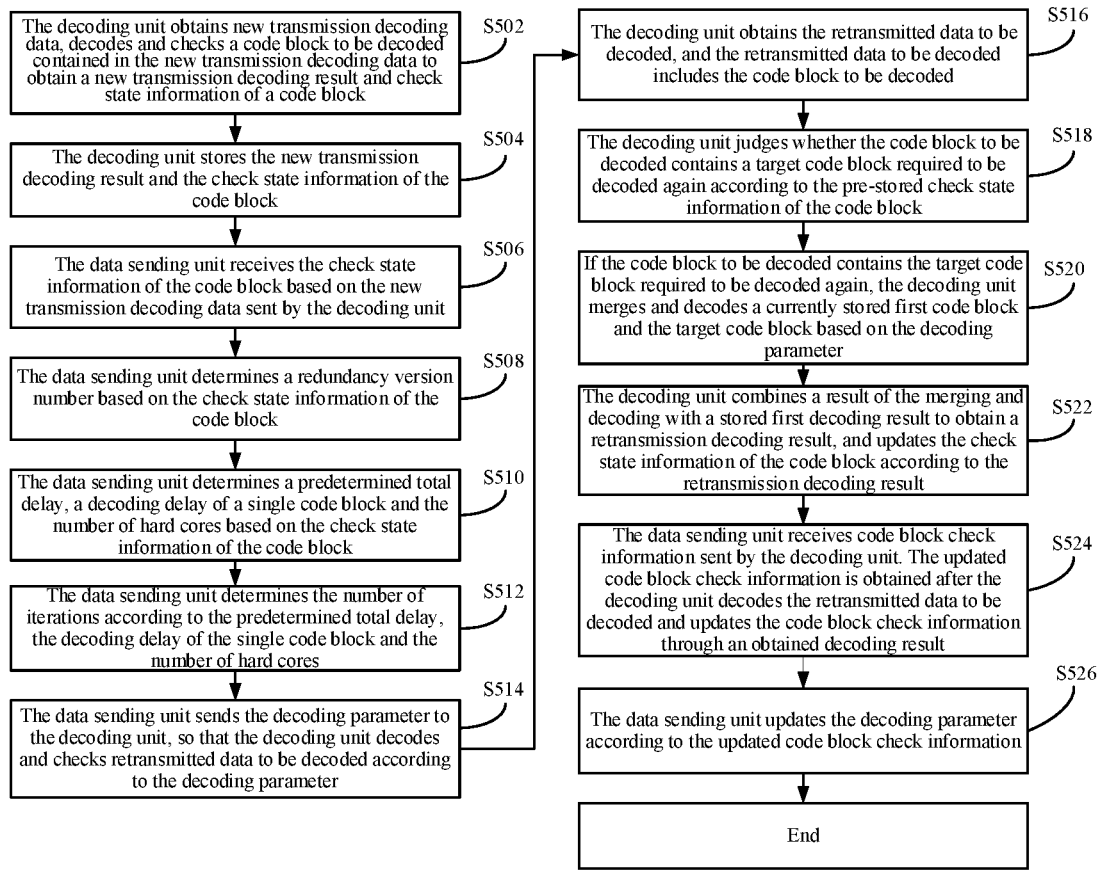
FIG. 5 is a schematic flow chart of a data retransmission decoding method according to yet another embodiment of the present disclosure.

As shown in FIG. 5, an embodiment of the present disclosure provides a data retransmission decoding method. An execution body of the method may be a decoding unit and a data sending unit. The decoding unit may be may be a decoding unit in any communication device (such as a base station or a terminal device, etc.), and the data sending unit may be a data sending unit in any communication device (such as a base station or a terminal device, etc.). The method may specifically include the following steps.

In step S502, the decoding unit obtains new transmission decoding data, decodes and checks a code block to be decoded contained in the new transmission decoding data to obtain a new transmission decoding result and check state information of a code block.

In step S504, the decoding unit stores the new transmission decoding result and the check state information of the code block.

In step S506, the data sending unit receives the check state information of the code block based on the new transmission decoding data sent by the decoding unit.

In step S508, the data sending unit determines a redundancy version number based on the check state information of the code block.

Herein, the redundancy version number may be used to determine a redundancy version for decoding, and the later the redundancy version number is, the greater the amount of redundancy information it carries.

In implementation, the decoding unit may send the check state information of the code block to the data sending unit. The data sending unit may determine a decoding parameter during retransmission decoding according to the number of error code blocks in the check state information of the code block.

In step S510, the data sending unit determines a predetermined total delay, a decoding delay of a single code block and the number of hard cores based on the check state information of the code block.

Herein, the predetermined total delay may be any predetermined duration, such as 1 second or 5 seconds, etc. The decoding delay of the single code block may also be any predetermined duration, and the number of hard cores may be the number of hard cores contained in the decoding unit for decoding.

In step S512, the data sending unit determines the number of iterations according to the predetermined total delay, the decoding delay of the single code block and the number of hard cores.

In implementation, the number of iterations of retransmission decoding may be determined according to the obtained predetermined total delay, the decoding delay of the single code block and the number of hard cores. For example, the number of iterations may be:

$$ite = \frac{s\_cyle * core\_num}{err\_cb\_num * dec\_cycle}$$

where ite is the number of iterations, s_cycle is the predetermined total delay, core_num is the number of hard cores, err_cb_num is the number of error code blocks in the check state information of the code block, and dec_cycle is the decoding delay of the single code block. It can be seen from the above formula that the larger the total delay of the system, the larger the number of decoding hard cores, the smaller the number of error code blocks in the check state information of the code block, and the smaller the single decoding delay, the greater the number of iterations as calculated, the greater the probability of decoding pairing, and the better the corresponding decoding performance.

In step S514, the data sending unit sends the decoding parameter to the decoding unit, so that the decoding unit decodes and checks retransmitted data to be decoded according to the decoding parameter.

In step S516, the decoding unit obtains the retransmitted data to be decoded, and the retransmitted data to be decoded includes the code block to be decoded.

In step S518, the decoding unit judges whether the code block to be decoded contains a target code block required to be decoded again according to the pre-stored check state information of the code block.

The specific processing procedures of the above steps S516-S518 may refer to the relevant contents in S102-S104 of the Embodiment 1, and may not be repeated here.

In step S520, if the code block to be decoded contains the target code block required to be decoded again, the decoding unit merges and decodes a currently stored first code block and the target code block based on the decoding parameter.

Herein, the decoding parameter may include the redundancy version number and the number of iterations. The redundancy version number may be used to determine a starting column position of the code block transmitted this time, and the merging may be performed according to the redundancy version number.

The specific processing procedure of the above step S520 may refer to the relevant contents in S106 of the Embodiment 1, and may not repeated here.

In step S522, the decoding unit combines a result of the merging and decoding with a stored first decoding result to obtain a retransmission decoding result, and updates the check state information of the code block according to the retransmission decoding result.

The specific processing procedure of the above step S522 may refer to the relevant contents in S106 of the Embodiment 1, and may not repeated here.

In step S524, the data sending unit receives code block check information sent by the decoding unit. The updated code block check information is obtained after the decoding unit decodes the retransmitted data to be decoded and updates the code block check information through an obtained decoding result.

In step S526, the data sending unit updates the decoding parameter according to the updated code block check information.

In implementation, the data sending unit updates the decoding parameter. If a request for data retransmission sent by the decoding unit is received again, an updated decoding parameter may be sent to the decoding unit again, so that the decoding unit may decode and check the retransmitted data to be decoded received for the third time.

The embodiment of the present disclosure provides a data retransmission decoding method. The decoding unit obtains the retransmitted data to be decoded including the code block to be decoded, and then judges whether the code block to be decoded includes the target code block required to be decoded again according to the pre-stored check state information of the code block. If the code block to be decoded includes the target code block required to be decoded again, the currently stored first code block and the target code block are merged and decoded based on the decoding parameter, where the first code block is a code block corresponding to the target code block. The data sending unit may determine the decoding parameter according to the received check state information of the code block based on the new transmission decoding data sent by the decoding unit. In this way, the decoding unit may determine the target code block required to be decoded again according to the check state information of the code block, and only decode the target code block required to be decoded again according to the received retransmission data, which may ensure the decoding quality and improve the decoding performance when the data amount is relatively large. The data sending unit may dynamically calculate the number of decoding and iterations online in real time according to the check state information of the code block sent by the decoding unit, which may reduce the resource waste of the decoding unit during retransmission decoding and improve the performance of a decoder.

Embodiment 5

The above are the data retransmission decoding methods provided by the embodiments of the present disclosure. Based on the same concept, an embodiment of the present disclosure further provides a data retransmission decoding system, which includes a decoding unit and a data sending unit. The data sending unit is configured to receive check state information of a code block based on new transmission decoding data or retransmitted data to be decoded sent by the decoding unit, determine a decoding parameter according to the check state information of the code block, and send the decoding parameter to the decoding unit. The decoding unit is configured to obtain the new transmission decoding data or the retransmitted data to be decoded, where the new transmission decoding data and the retransmitted data to be decoded include a code block to be decoded; judge whether the code block to be decoded includes a target code block required to be decoded again according to stored check state information of a previously decoded code block; and merge and decode a currently stored first code block and the target code block based on the decoding parameter if the code block to be decoded includes the target code block required to be decoded again, where the first code block is a code block corresponding to the target code block.

Herein, after decoding the obtained new transmission decoding data, the decoding unit may send the stored check state information of the code block based on the new transmission decoding data to the data sending unit. After receiving the check state information of the code block based on the new transmission decoding data, the data sending unit may determine the decoding parameter according to the code block check information and send it to the decoding unit. After decoding the obtained retransmitted decoded data, the decoding unit merges the result of the merging and decoding with the stored first decoding result, updates the check state information of the code block, and sends the updated check state information of the code block to the data sending unit. After receiving the updated check state information of the code block based on the retransmitted data to be decoded, the data sending unit may calculate the decoding parameter again according to the updated check state information of the code block, and may send the decoding parameter to the decoding unit, so that after receiving the retransmitted data to be decoded again, the decoding unit may decode the retransmitted data to be decoded that is received again according to the decoding parameter.

In the embodiment of the present disclosure, the decoding unit is configured to obtain the retransmitted data to be decoded, the retransmitted data to be decoded including the code block to be decoded; judge whether the code block to be decoded includes the target code block required to be decoded again according to the stored check state information of the previously decoded code block; and merge and decode the currently stored first code block and the target code block based on the predetermined decoding parameter if the code block to be decoded includes the target code block required to be decoded again, where the first code block is the code block corresponding to the target code block.

In the embodiment of the present disclosure, the decoding unit is configured to combine the result of the merging and decoding with the stored first decoding result to obtain the retransmission decoding result, wherein the first decoding result is a decoding result of a code block decoded correctly in a previous decoding process.

The method further includes updating the check state information of the code block according to the retransmission decoding result.

In the embodiment of the present disclosure, the decoding unit is configured to send the check state information of the code block to the data sending unit, so that the data sending unit determines the predetermined decoding parameter according to the check state information of the code block; and receive the predetermined decoding parameter sent by the data sending unit.

In the embodiment of the present disclosure, the decoding unit is configured to receive the number of iterations determined by the data sending unit based on the check state information of the code block, a predetermined total delay, a decoding delay of a single code block and the number of hard cores; where the number of iterations is:

$$ite = \frac{s\_cyle * core\_num}{err\_cb\_num * dec\_cycle}$$

where ite is the number of iterations, s_cycle is the predetermined total delay, core_num is the number of hard cores, err_cb_num is the number of error code blocks in the check state information of the code block, and dec_cycle is the decoding delay of the single code block.

In the embodiment of the present disclosure, the decoding unit is configured to obtain new transmission decoding data, decode and check a code block to be decoded contained in the new transmission decoding data to obtain a new transmission decoding result and the check state information of the code block; and store the new transmission decoding result and the check state information of the code block.

In the embodiment of the present disclosure, check modes for checking the code block include: a cyclic redundancy check (CRC) mode, a Hartenberg matrix check mode, and a combination of the CRC mode and the Hartenberg matrix check mode.

In the embodiment of the present disclosure, the predetermined decoding parameter further includes a redundancy version number, and the decoding unit is configured to determine redundant data corresponding to the target code block in the first code block based on the redundancy version number; and merge and decode the redundant data and the target code block.

In the embodiment of the present disclosure, the data sending unit is configured to receive the check state information of the code block based on the new transmission decoding data sent by the decoding unit; determine the decoding parameter according to the check state information of the code block; and send the decoding parameter to the decoding unit, so that the decoding unit decodes and checks the retransmitted data to be decoded according to the decoding parameter.

In the embodiment of the present disclosure, the data sending unit is configured to receive updated code block check information sent by the decoding unit, where the updated code block check information is obtained after the decoding unit decodes the retransmitted data to be decoded and updates the code block check information through an obtained decoding result; and update the decoding parameter according to the updated code block check information.

In the embodiment of the present disclosure, the decoding parameter includes the redundancy version number and the number of iterations. The data sending unit is configured to determine the redundancy version number based on the check state information of the code block; determine the predetermined total delay, the decoding delay of the single code block and the number of hard cores based on the check state information of the code block; and determine the number of iterations according to the predetermined total delay, the decoding delay of the single code block and the number of hard cores, where the number of iterations is:

$$ite = \frac{s\_cyle * core\_num}{err\_cb\_num * dec\_cycle}$$

where ite is the number of iterations, s_cycle is the predetermined total delay, core_num is the number of hard cores, err_cb_num is the number of error code blocks in the check state information of the code block, and dec_cycle is the decoding delay of the single code block.

The embodiment of the present disclosure provides a data retransmission decoding system, which is used for a data retransmission decoding method, including: the decoding unit obtaining the retransmitted data to be decoded, the retransmitted data to be decoded including the code block to be decoded; judging whether the code block to be decoded includes the target code block required to be decoded again according to the stored check state information of the previously decoded code block; and merging and decoding the currently stored first code block and the target code block based on the predetermined decoding parameter if the code block to be decoded includes the target code block required to be decoded again, where the first code block is the code block corresponding to the target code block. In this way, the decoding unit may determine the target code block required to be decoded again according to the check state information of the code block, and only decode the target code block required to be decoded again according to the received retransmission data, which may ensure the decoding quality and improve the decoding performance when the data amount is relatively large. The data sending unit may dynamically calculate the number of decoding and iterations online in real time according to the check state information of the code block sent by the decoding unit, which may reduce the resource waste of the decoding unit during retransmission decoding and improve the performance of a decoder.

At least one of the above technical solutions used in the embodiment of the present disclosure can achieve the following beneficial effects: the decoding unit may determine the target code block required to be decoded again according to the check state information of the code block, and only decode the target code block required to be decoded again according to the received retransmission data, which may ensure the decoding quality and improve the decoding performance when the data amount is relatively large.

Embodiment 6

Figure 6:
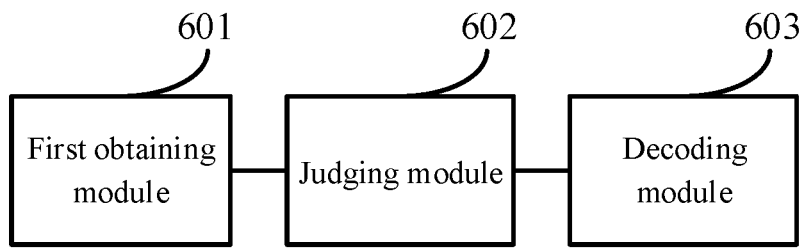
FIG. 6 is a schematic structural diagram of a data retransmission decoding apparatus according to an embodiment of the present disclosure.

The above are the data retransmission decoding methods provided by the embodiments of the present disclosure. Based on the same concept, an embodiment of the present disclosure further provides a data retransmission decoding apparatus, as shown in FIG. 6.

The data retransmission decoding apparatus includes a first obtaining module 601, a judging module 602 and a decoding module 603. The first obtaining module 601 is configured to obtain retransmitted data to be decoded, where the retransmitted data to be decoded includes a code block to be decoded. The judging module 602 is configured to judge whether the code block to be decoded includes a target code block required to be decoded again according to stored check state information of a previously decoded code block. The decoding module 603 is configured to merge and decode a currently stored first code block and the target code block based on a predetermined decoding parameter if the code block to be decoded includes the target code block required to be decoded again, where the first code block is a code block corresponding to the target code block.

In the embodiment of the present disclosure, the apparatus further includes a combination module configured to combine a result of the merging and decoding with a stored first decoding result to obtain a retransmission decoding result, wherein the first decoding result is a decoding result of a code block decoded correctly in a previous decoding process.

The apparatus also includes an updating module configured to update the check state information of the code block according to the retransmission decoding result.

In the embodiment of the present disclosure, the apparatus further includes: a sending module and a first receiving module. The sending module is configured to send the check state information of the code block to a data sending unit, so that the data sending unit determines the predetermined decoding parameter according to the check state information of the code block. The first receiving module is configured to receive the predetermined decoding parameter sent by the data sending unit.

In the embodiment of the present disclosure, the predetermined decoding parameter includes the number of iterations, and the first receiving module includes a first receiving unit configured to receive the number of iterations determined by the data sending unit based on the check state information of the code block, a predetermined total delay, a decoding delay of a single code block and the number of hard cores; where the number of iterations is:

$$ite = \frac{s\_cyle^*core\_num}{err\_cb\_num^*dec\_cycle}$$

where ite is the number of iterations, s_cycle is the predetermined total delay, core_num is the number of hard cores, err_cb_num is the number of error code blocks in the check state information of the code block, and dec_cycle is the decoding delay of the single code block.

In the embodiment of the present disclosure, the first obtaining module 601 is configured to obtain new transmission decoding data, decode and check a code block to be decoded contained in the new transmission decoding data to obtain a new transmission decoding result and the check state information of the code block.

The apparatus further includes a storage module configured to store the new transmission decoding result and the check state information of the code block.

In the embodiment of the present disclosure, check modes for checking the code block include: a cyclic redundancy check (CRC) mode, a Hartenberg (H) matrix check mode, and a CRC plus H matrix check mode.

In the embodiment of the present disclosure, the predetermined decoding parameter further includes a redundancy version number. The decoding module 603 includes: a decoding unit, configured to determine redundant data corresponding to the target code block in the first code block based on the redundancy version number; and a merging unit, configured to merge and decode the redundant data and the target code block.

The embodiment of the present disclosure provides a data retransmission decoding apparatus, which obtains retransmitted data to be decoded, the retransmitted data to be decoded including a code block to be decoded; judges whether the code block to be decoded includes a target code block required to be decoded again according to stored check state information of a previously decoded code block; and merges and decodes a currently stored first code block and the target code block based on a predetermined decoding parameter if the code block to be decoded includes the target code block required to be decoded again, where the first code block is a code block corresponding to the target code block. In this way, the decoding unit may determine the target code block required to be decoded again according to the check state information of the code block, and only decode the target code block required to be decoded again according to the received retransmission data, which may ensure the decoding quality and improve the decoding performance when the data amount is relatively large, and may also dynamically calculate the number of decoding and iterations online in real time according to the number of the code block to be decoded, thus improving the performance of the decoder.

Embodiment 7

Figure 7:
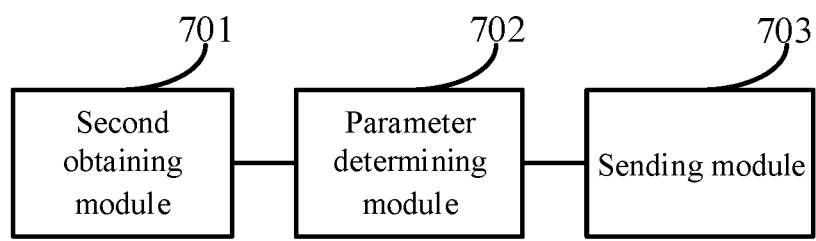
FIG. 7 is a schematic structural diagram of a data retransmission decoding apparatus according to another embodiment of the present disclosure.

The above are the data retransmission decoding methods provided by the embodiments of the present disclosure. Based on the same concept, an embodiment of the present disclosure further provides a data retransmission decoding apparatus, as shown in FIG. 7.

The data retransmission decoding apparatus includes a second obtaining module 701, a parameter determining module 702 and a sending module 703. The second obtaining module 701 is configured to receive check state information of a code block based on new transmission decoding data sent by a decoding unit. The parameter determining module 702 is configured to determine a decoding parameter according to the check state information of the code block. The sending module 703 is configured to send the decoding parameter to the decoding unit, so that the decoding unit decodes and checks retransmitted data to be decoded according to the decoding parameter.

In the embodiment of the present disclosure, the apparatus further includes a third receiving module and an updating module. The third receiving module is configured to receive updated code block check information sent by the decoding unit, where the updated code block check information is obtained after the decoding unit decodes the retransmitted data to be decoded and updates the code block check information through an obtained decoding result. The updating module is configured to update the decoding parameter according to the updated code block check information.

In the embodiment of the present disclosure, the decoding parameter includes a redundancy version number and the number of iterations. The parameter determining module 702 includes: a first determining unit, configured to determine the redundancy version number based on the check state information of the code block; a second determining unit, configured to determine a predetermined total delay, a decoding delay of a single code block and the number of hard cores based on the check state information of the code block; and a third determining unit, configured to the number of iterations according to the predetermined total delay, the decoding delay of the single code block and the number of hard cores, wherein the number of iterations is:

$$ite = \frac{s\_cyle^*core\_num}{err\_cb\_num^*dec\_cycle}$$

Where ite is the number of iterations, s_cycle is the predetermined total delay, core_num is the number of hard cores, err_cb_num is the number of error code blocks in the check state information of the code block, and dec_cycle is the decoding delay of the single code block.

The embodiment of the present disclosure provides a data retransmission decoding apparatus, which receives the check state information of the code block based on the new transmission decoding data sent by the decoding unit; determines the decoding parameter according to the check state information of the code block; and sends the decoding parameter to the decoding unit, so that the decoding unit decodes and checks the retransmitted data to be decoded according to the decoding parameter. In this way, the data sending unit may determine the decoding parameter according to the check state information of the code block sent by the decoding unit, and may determine corresponding decoding parameter according to different check state information of the code block, which may ensure that the decoding parameter used in retransmission decoding is dynamically adjusted according to different check state information of the code block, thus ensuring the decoding quality, saving system resources and improving the performance of a decoder.

Embodiment 8

Figure 8:
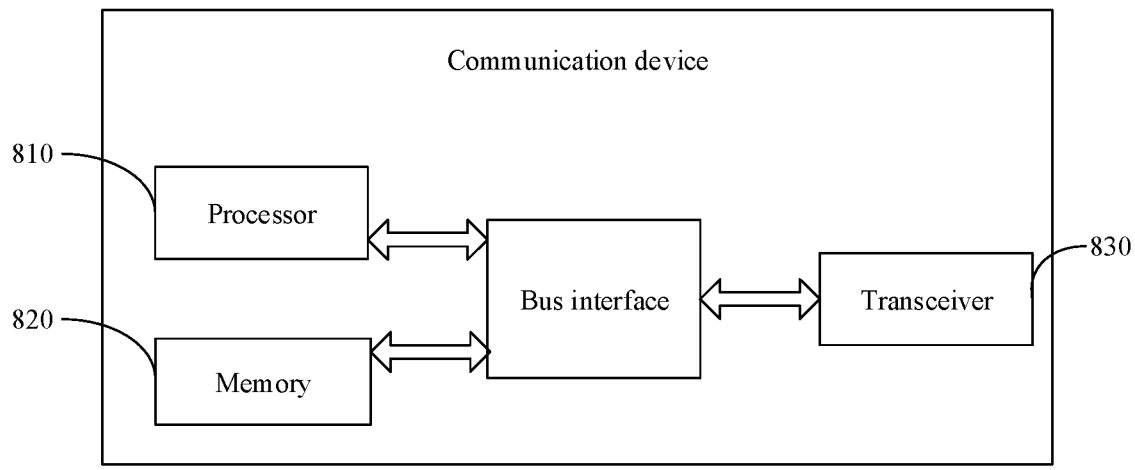
FIG. 8 is a schematic structural diagram of a communication device according to the present disclosure.

Corresponding to the data retransmission decoding methods and systems provided by the embodiments of the present disclosure, an embodiment of the present disclosure provides a communication device. As shown in FIG. 8, the communication device includes a processor 810, a memory 820, a transceiver 830, and a bus interface. Herein, in the embodiment of the present disclosure, the communication device further includes a computer program stored in the memory 820 and capable of running on the processor 810. When the computer program is executed by the processor 810, each process in the methods shown in FIGS. 1-5 above is realized and the same technical effect may be achieved. In order to avoid repetition, details are not repeated here.

In FIG. 8, a bus architecture may include any number of interconnected buses and bridges. Specifically, one or more processors represented by the processor 810 and various circuits of a memory represented by the memory 820 are linked together. The bus architecture may also link various other circuits, such as a peripheral device, a voltage regulator, a power management circuit, etc., which are all known in the art, and therefore, no further description will be given herein. The bus interface provides an interface. The transceiver 830 may be a plurality of elements, that is, including a transmitter and a receiver, providing a unit for communicating with various other apparatuses over a transmission medium.

The processor 810 is responsible for managing the bus architecture and general processing, and the memory 820 may store data used by the processor 810 when performing operations.

The embodiment of the present disclosure further provides a computer-readable storage medium, on which a computer program is stored. When the computer program is executed by a processor, each process of FIGS. 1-5 in the above-described method embodiment is realized, and the same technical effect may be achieved. In order to avoid repetition, details are not repeated here. Herein, the computer-readable storage medium is, for example, a Read-Only Memory (ROM), a Random Access Memory (RAM), a magnetic disk or an optical disk, etc.

It should be noted that in this document, the terms "include", "contain" or any other variant thereof are intended to cover a non-exclusive inclusion, such that a process, method, article, or device that includes a list of elements includes not only those elements, but also other elements not explicitly listed or inherent to such process, method, article, or device. Without further limitation, the element defined by the statement "includes a . . . " does not exclude the presence of another identical element in the process, method, article or device that includes the element.

Those skilled in the art may appreciate that the embodiments of the present disclosure may be provided as a method or a computer program product. Therefore, the present disclosure may take the form of an entirely hardware embodiment, an entirely software embodiment, or an embodiment combining software and hardware. Furthermore, the present disclosure may take the form of a computer program product implemented on one or more computer-usable storage media (including but not limited to a disk storage, a CD-ROM, an optical storage, etc.) containing a computer-usable program code therein.

The above description is only an embodiment of the present disclosure and is not intended to limit the present disclosure. For those skilled in the art, the present disclosure may have various modifications and changes. Any modification, equivalent substitution, improvement, etc. made within the spirit and principle of the present disclosure shall be contained within the scope of the claims of the present disclosure.

What is claimed is:

1. A data retransmission decoding method, wherein the method is applied to a decoding unit, and the method comprises:
obtaining retransmitted data to be decoded, the retransmitted data to be decoded comprising a code block to be decoded;
judging whether the code block to be decoded comprises a target code block required to be decoded again according to stored check state information of a previously decoded code block; and
merging and decoding a currently stored first code block and the target code block based on a predetermined decoding parameter when the code block to be decoded comprises the target code block required to be decoded again, wherein the first code block is a code block corresponding to the target code block.

2. The method according to claim 1, wherein after merging and decoding the currently stored first code block and the target code block, the method further comprises:
combining a result of the merging and decoding with a stored first decoding result to obtain a retransmission decoding result, wherein the first decoding result is a decoding result of a code block decoded correctly in a previous decoding process;
the method further comprises:
updating the check state information of the code block according to the retransmission decoding result.

3. The method according to claim 1, further comprising:
sending the check state information of the code block to a data sending unit, for the data sending unit to determine the predetermined decoding parameter according to the check state information of the code block; and
receiving the predetermined decoding parameter sent by the data sending unit.

4. The method according to claim 3, wherein the predetermined decoding parameter comprises the number of iterations, and receiving the predetermined decoding parameter sent by the data sending unit comprises:
receiving the number of iterations determined by the data sending unit based on the check state information of the code block, a predetermined total delay, a decoding delay of a single code block and the number of hard cores;
wherein the number of iterations is:

$$ite = \frac{s\_cyle * core\_num}{err\_cb\_num * dec\_cycle}$$

wherein, ite is the number of iterations, s_cycle is the predetermined total delay, core_num is the number of hard cores, err_cb_num is the number of error code blocks in the check state information of the code block, and dec_cycle is the decoding delay of the single code block.

5. The method according to claim 4, wherein the predetermined decoding parameter further comprises a redundancy version number, and merging and decoding the currently stored first code block and the target code block based on the predetermined decoding parameter comprises:
determining redundant data corresponding to the target code block in the first code block based on the redundancy version number; and
merging and decoding the redundant data and the target code block.

6. The method according to claim 1, wherein before obtaining the retransmitted data to be decoded, the method further comprises:

obtaining new transmission decoding data, decoding and checking a code block to be decoded contained in the new transmission decoding data to obtain a new transmission decoding result and the check state information of the code block; and storing the new transmission decoding result and the check state information of the code block.

7. The method according to claim 6, wherein check modes for checking the code block comprise at least one of: a cyclic redundancy check (CRC) mode, a Hartenberg matrix check mode, and a combination of the CRC mode and the Hartenberg matrix check mode.

8. A data retransmission decoding method, wherein the method is applied to a data sending unit, and the method comprises:

receiving check state information of a code block based on new transmission decoding data sent by a decoding unit;

determining a decoding parameter according to the check state information of the code block; and sending the decoding parameter to the decoding unit, for the decoding unit to decode and check retransmitted data to be decoded according to the decoding parameter.

9. The method according to claim 8, further comprising:

receiving updated code block check information sent by the decoding unit, wherein the updated code block check information is obtained after the decoding unit decodes the retransmitted data to be decoded and updates the code block check information through an obtained decoding result; and updating the decoding parameter according to the updated code block check information.

10. The method according to claim 8, wherein the decoding parameter comprises a redundancy version number and the number of iterations, and the determining the decoding parameter according to the check state information of the code block comprises:

determining the redundancy version number based on the check state information of the code block;

determining a predetermined total delay, a decoding delay of a single code block and the number of hard cores based on the check state information of the code block; and determining the number of iterations according to the predetermined total delay, the decoding delay of the single code block and the number of hard cores, wherein the number of iterations is:

$$ite = \frac{s\_cyle * core\_num}{err\_cb\_num * dec\_cycle}$$

wherein, ite is the number of iterations, s_cycle is the predetermined total delay, core_num is the number of hard cores, err_cb_num is the number of error code blocks in the check state information of the code block, and dec_cycle is the decoding delay of the single code block.

11. A communication device, comprising a processor, a memory and a computer program stored on the memory and capable of running on the processor to implement a data retransmission decoding method applied to a decoding unit, and the method comprises:

obtaining retransmitted data to be decoded, the retransmitted data to be decoded comprising a code block to be decoded;

judging whether the code block to be decoded comprises a target code block required to be decoded again according to stored check state information of a code block decoded last time; and merging and decoding a currently stored first code block and the target code block based on a predetermined decoding parameter when the code block to be decoded comprises the target code block required to be decoded again, wherein the first code block is a code block corresponding to the target code block.

12. A communication device according to claim 11, wherein after merging and decoding the currently stored first code block and the target code block, the method further comprises:

combining a result of the merging and decoding with a stored first decoding result to obtain a retransmission decoding result, wherein the first decoding result is a decoding result of a code block decoded correctly in a last decoding process;

the method further comprises:

updating the check state information of the code block according to the retransmission decoding result.

13. The communication device according to claim 11, further comprising:

sending the check state information of the code block to a data sending unit, for the data sending unit to determine the predetermined decoding parameter according to the check state information of the code block; and receiving the predetermined decoding parameter sent by the data sending unit.

14. The communication device according to claim 13, wherein the predetermined decoding parameter comprises the number of iterations, and receiving the predetermined decoding parameter sent by the data sending unit comprises:

receiving the number of iterations determined by the data sending unit based on the check state information of the code block, a predetermined total delay, a decoding delay of a single code block and the number of hard cores;

wherein the number of iterations is:

$$ite = \frac{s\_cyle * core\_num}{err\_cb\_num * dec\_cycle}$$

wherein, ite is the number of iterations, s_cycle is the predetermined total delay, core_num is the number of hard cores, err_cb_num is the number of error code blocks in the check state information of the code block, and dec_cycle is the decoding delay of the single code block.

15. The communication device according to claim 14, wherein the predetermined decoding parameter further comprises a redundancy version number, and merging and decoding the currently stored first code block and the target code block based on the predetermined decoding parameter comprises:

determining redundant data corresponding to the target code block in the first code block based on the redundancy version number; and merging and decoding the redundant data and the target code block.

16. The communication device according to claim 11, wherein before obtaining the retransmitted data to be decoded, the method further comprises:
   obtaining new transmission decoding data, decoding and checking a code block to be decoded contained in the new transmission decoding data to obtain a new transmission decoding result and the check state information of the code block; and
   storing the new transmission decoding result and the check state information of the code block.

17. The communication device according to claim 16, wherein check modes for checking the code block comprise: a cyclic redundancy check (CRC) mode, a Hartenberg matrix check mode, and a combination of the CRC mode and the Hartenberg matrix check mode.

18. The communication device according to claim 11, wherein the method is further applied to a data sending unit and comprises:
   receiving check state information of a code block based on new transmission decoding data sent by a decoding unit;
   determining a decoding parameter according to the check state information of the code block; and
   sending the decoding parameter to the decoding unit, for the decoding unit to decode and check retransmitted data to be decoded according to the decoding parameter.

19. The communication device according to claim 18, further comprising:
   receiving updated code block check information sent by the decoding unit, wherein the updated code block check information is obtained after the decoding unit decodes the retransmitted data to be decoded and updates the code block check information through an obtained decoding result; and
   updating the decoding parameter according to the updated code block check information.

20. The communication device according to claim 19, wherein the decoding parameter comprises a redundancy version number and the number of iterations, and the determining the decoding parameter according to the check state information of the code block comprises:
   determining the redundancy version number based on the check state information of the code block;
   determining a predetermined total delay, a decoding delay of a single code block and the number of hard cores based on the check state information of the code block; and
   determining the number of iterations according to the predetermined total delay, the decoding delay of the single code block and the number of hard cores, wherein the number of iterations is:

$$ite = \frac{s\_cyle * core\_num}{err\_cb\_num * dec\_cycle}$$

wherein, ite is the number of iterations, s_cycle is the predetermined total delay, core_num is the number of hard cores, err_cb_num is the number of error code blocks in the check state information of the code block, and dec_cycle is the decoding delay of the single code block.

* * * * *